(12) United States Patent
Hirler et al.

(10) Patent No.: US 10,547,291 B2
(45) Date of Patent: Jan. 28, 2020

(54) CIRCUIT WITH A PLURALITY OF TRANSISTORS AND METHOD FOR CONTROLLING SUCH A CIRCUIT

(71) Applicant: Infineon Technologies Austria AG, Villach (AT)

(72) Inventors: Franz Hirler, Isen (DE); Anton Mauder, Kolbermoor (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 347 days.

(21) Appl. No.: 14/968,540

(22) Filed: Dec. 14, 2015

(65) Prior Publication Data

US 2016/0099707 A1 Apr. 7, 2016

Related U.S. Application Data

(63) Continuation of application No. 13/893,450, filed on May 14, 2013, now Pat. No. 9,231,565.

(51) Int. Cl.
*H03K 5/00* (2006.01)
*H03K 3/012* (2006.01)
*H03K 17/16* (2006.01)
*H03K 17/74* (2006.01)

(52) U.S. Cl.
CPC .............. *H03K 3/012* (2013.01); *H03K 17/16* (2013.01); *H03K 17/168* (2013.01); *H03K 17/74* (2013.01); *H03K 2217/0036* (2013.01)

(58) Field of Classification Search
None
See application file for complete search history.

(56) References Cited

U.S. PATENT DOCUMENTS

| 4,242,624 | A | 12/1980 | Schalk |
| 5,343,098 | A | 8/1994 | Miyasaka |
| 5,719,529 | A * | 2/1998 | Kawahara ............. H03F 3/3067 330/253 |
| 5,732,028 | A | 3/1998 | Shin |
| 6,046,915 | A | 4/2000 | Jacobs et al. |
| 7,180,349 | B2 | 2/2007 | Leifso et al. |
| 7,285,992 | B1 * | 10/2007 | Maida ..................... H03F 3/301 327/112 |
| 7,804,337 | B2 | 9/2010 | Payne et al. |

(Continued)

FOREIGN PATENT DOCUMENTS

| CN | 102099993 A | 6/2011 |
| CN | 102958263 A | 3/2013 |

*Primary Examiner* — Lincoln D Donovan
*Assistant Examiner* — Khareem E Almo
(74) *Attorney, Agent, or Firm* — Murphy, Bilak & Homiller, PLLC

(57) ABSTRACT

A circuit includes a transistor circuit including a first node, a second node, and a plurality of transistors coupled in parallel between the first node and the second node. The circuit further includes a drive circuit configured to switch on a first group of the plurality of transistors, the first group including a first subgroup and a second subgroup and each of the first subgroup and the second subgroup including one or more of the transistors. The drive circuit is further configured to switch off the first subgroup at the end of a first time period and switch off the second subgroup at a time instant before the end of the first time period.

35 Claims, 9 Drawing Sheets

(56) References Cited

U.S. PATENT DOCUMENTS

| | | |
|---|---|---|
| 8,368,432 B2 | 2/2013 | Butselaar et al. |
| 8,619,382 B2 | 12/2013 | Kuehlwein |
| 8,710,875 B2 | 4/2014 | Bali et al. |
| 8,779,807 B2 | 7/2014 | Liang |
| 8,963,585 B2 * | 2/2015 | Lobsiger ............... H02M 1/088 323/285 |
| 2004/0056702 A1 | 3/2004 | Nagasu et al. |
| 2005/0184952 A1 | 8/2005 | Konno et al. |
| 2008/0007883 A1 | 1/2008 | Arndt et al. |
| 2009/0080465 A1 | 3/2009 | Yang et al. |
| 2009/0219060 A1 | 9/2009 | Payne et al. |
| 2009/0284303 A1 | 11/2009 | Hu et al. |
| 2010/0271081 A1 | 10/2010 | Caiafa et al. |
| 2011/0089865 A1 | 4/2011 | Wang et al. |
| 2011/0121812 A1 | 5/2011 | Salvestrini |
| 2011/0140763 A1 | 6/2011 | Noh et al. |
| 2012/0032725 A1 | 2/2012 | Hiyama |
| 2012/0043906 A1 | 2/2012 | Jones |
| 2012/0098577 A1 * | 4/2012 | Lobsiger ............... H02M 1/088 327/109 |
| 2012/0249191 A1 | 10/2012 | Marie et al. |
| 2012/0293214 A1 | 11/2012 | Blom |
| 2012/0293219 A1 * | 11/2012 | Bai ..................... H02M 3/1588 327/109 |
| 2012/0313669 A1 | 12/2012 | Pan et al. |
| 2013/0049816 A1 | 2/2013 | Cioci |
| 2013/0106469 A1 | 5/2013 | Slavov et al. |
| 2013/0162300 A1 * | 6/2013 | Liu ................... H03K 19/0005 327/108 |
| 2013/0285471 A1 | 10/2013 | Ren et al. |
| 2013/0285703 A1 | 10/2013 | McGinn |
| 2013/0301326 A1 | 11/2013 | Zoels et al. |
| 2013/0314146 A1 | 11/2013 | Lin |
| 2014/0002137 A1 | 1/2014 | Friedman et al. |
| 2014/0035627 A1 | 2/2014 | Dunipace |
| 2014/0055170 A1 | 2/2014 | Liang |
| 2014/0111495 A1 * | 4/2014 | Iwase ................... G09G 3/3677 345/211 |
| 2014/0139941 A1 | 5/2014 | Kuehlwein |
| 2014/0375357 A1 * | 12/2014 | Kumar ............ H03K 19/00384 327/77 |
| 2015/0023080 A1 * | 1/2015 | Chambon ........... H02M 1/0845 363/131 |
| 2015/0137661 A1 * | 5/2015 | Otsuka ................. B41J 2/04588 310/316.03 |
| 2015/0155875 A1 * | 6/2015 | Wada ............... H03K 19/01851 327/108 |
| 2016/0087633 A1 * | 3/2016 | Zhang ............. H03K 19/01857 327/109 |

* cited by examiner

CIRCUIT WITH A PLURALITY OF TRANSISTORS AND METHOD FOR CONTROLLING SUCH A CIRCUIT

TECHNICAL FIELD

Embodiments of the present disclosure relate to a circuit with a plurality of bipolar transistors and to a method for controlling such circuit.

BACKGROUND

Bipolar transistors such as IGBTs (Insulated Gate Bipolar Transistors) are widely used in different applications in the automotive and industrial field. For example, in motor control or drives applications, IGBTs are often used in a power stage for driving a load. Within such applications, the IGBTs may be cyclically switched on and off.

In electronic circuits, especially in power circuits that drive a load, diodes can be employed as free-wheeling elements that may prevent damage to transistors by suppressing voltage spikes or transients which may occur in switching operations.

In operation of bipolar semiconductor device, such as bipolar transistors and diodes, conduction losses occur. These conduction losses are dependent on a voltage across the respective device and current through the device.

Further, a charge carrier plasma with n-type charge carriers and p-type charge carriers is stored in a bipolar semiconductor device when the semiconductor device is in a conducting state, that is, when the semiconductor device is conducting a current. When an operation state of the semiconductor device changes from a conducting state to a non-conducting state these charges have to be removed from the respective device. This process is often referred to as reverse recovery process. During the reverse recovery process, the charge carriers flowing out of the device cause a reverse current. This reverse current multiplied with the voltage across the device during the reverse recovery process equals the power losses resulting from the reverse recovery process. The time integral of these losses equals the energy that is dissipated each time the device changes from the conducting state to the non-conducting state.

For example, in a half bridge circuit, that includes two semiconductor devices connected in series, losses are not only induced in the device that switches off but also in the other device that is going to take over the load current as this device sees typically a very high voltage, this device may e.g. be a freewheeling diode.

In general, at a given current rating and a given voltage blocking capability, devices with a low forward voltage (and low conduction losses) have a higher reverse recovery charge, and vice versa. Usually, the current rating of a device is chosen in accordance with the highest currents occurring in an application in which the device is implemented. A device with a high current rating has a large chip size and has a high reverse recovery charge. When the device operates at currents below the current rating, the device is over-dimensioned so that at low currents relatively high losses resulting from the reverse recovery charge occur.

It is therefore desirable to reduce transistor and diode losses in electronic circuit applications, in particular in power electronics applications.

SUMMARY

A method to for operating a circuit is disclosed. The circuit includes a first node, a second node, and a plurality of bipolar transistors coupled in parallel between the first node and the second node. In accordance with one embodiment of the present invention, the method includes in one drive cycle, switching on bipolar transistors of a first group of the plurality of bipolar transistors, wherein the first group includes a first subgroup and a second subgroup and each of the first subgroup and the second subgroup includes one or more of the bipolar transistors. The method further includes switching off the bipolar transistors of the first subgroup at the end of the first time period and switching off the bipolar transistors of the second subgroup at a time instant before the end of the first time period.

Further, a circuit is disclosed. In accordance with one embodiment of the present invention, the circuit includes a bipolar transistor circuit with a first node, a second node, and a plurality of bipolar transistors coupled in parallel between the first node and the second node. A drive circuit is configured to switch on a first group of the plurality of bipolar transistors, wherein the first group includes a first subgroup and a second subgroup and each of the first subgroup and the second subgroup includes one or more of the bipolar transistors. The drive circuit is further configured to switch off the first subgroup at the end of a first time period and to switch off the second subgroup at a time instant before the end of the first time period.

A further embodiment relates to method of operating a circuit. The circuit includes a first node, a second node and a plurality of bipolar transistors coupled in parallel between the first node and the second node. The method comprises in one drive cycle: selecting a first group of the plurality of bipolar transistors, the first group including a first subgroup and a second subgroup and each of the first subgroup and the second subgroup including one or more bipolar transistors; switching on the bipolar transistors of the first group at the beginning of a first time period; switching off the bipolar transistors of the first subgroup at the end of the first time period; and keeping switched off the bipolar transistors of the second subgroup at a time instant before the end of the first time period.

Those skilled in the art will recognize additional features and advantages upon reading the following detailed description and on viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings, which form a part thereof, and in which are shown by way of illustration specific embodiments in which the invention may be practiced. It is to be understood that the features of the various embodiments described herein may be combined with each other, unless specifically noted otherwise.

Figure 1:
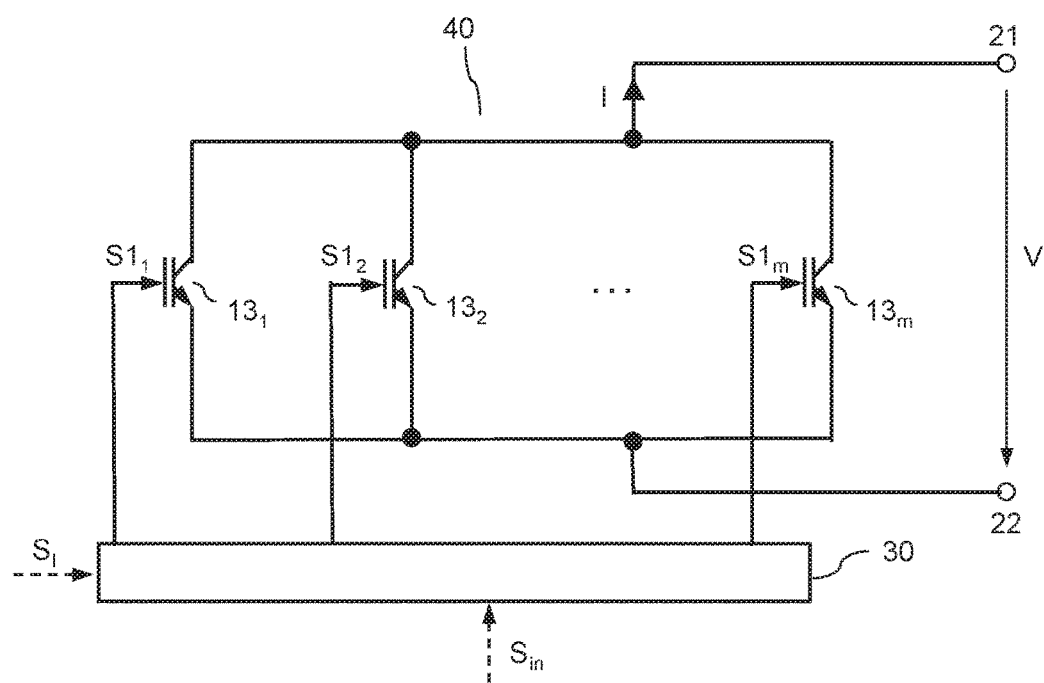
FIG. 1 illustrates a first embodiment of a bipolar transistor circuit including a plurality of bipolar transistors.

FIG. 1 illustrates one embodiment of a circuit 40 that will be referred to as bipolar transistor circuit in the following. The bipolar transistor circuit 40 includes a plurality of m, with m≥2, bipolar transistors $13_1$-$13_m$. The bipolar transistors $13_1$-$13_m$ are implemented as IGBTs in the present embodiment.

However, other types of bipolar transistors, such as BJTs (Bipolar Junction Transistors) may be used as well. Referring to FIG. 1, the individual IGBTs $13_1$-$13_m$ have their load paths (collector-emitter paths) coupled in parallel and coupled between a first circuit node 21 and a second circuit node 22. That is, each of the IGBTs $13_1$-$13_m$ has its collector coupled to the first node 21 and has its emitter coupled to the second node 22.

The circuit shown in FIG. 1 includes m=3 IGBTs. However, this is only an example. The overall number of IGBTs may vary dependent on the specific application where the bipolar transistor circuit 40 is employed.

Each of the individual IGBTs $13_1$-$13_m$ receives a corresponding drive signal $S1_1$-$S1_m$ from a drive circuit 30. Each of these drive signals $S1_1$-$S1_m$ is configured to switch on or to switch off the corresponding IGBT $13_1$-$13_m$, wherein the individual IGBTs $13_1$-$13_m$ can be switched on and off independent of each other. Each of the drive signals $S1_1$-$S1_m$ may assume one of a first signal level (on-level) that switches on the corresponding IGBT $13_1$-$13_m$, and a second signal level (off-level) that switches off the corresponding IGBT $13_1$-$13_m$. When the drive signal of one IGBT has the on-level, a voltage level of the gate-emitter voltage (which is a voltage between the gate terminal and the emitter terminal) of the corresponding IGBT is above a threshold voltage, and when the drive signal of one IGBT has the off-level, a voltage level of the gate-emitter is below the threshold voltage.

In the embodiment illustrated in FIG. 1, each of the IGBTs $13_1$-$13_m$ receives an individual drive signal $S1_1$-$S1_m$. However, this is only an example. It is even possible to drive two or more of the IGBTs $13_1$-$13_m$ using only one drive signal.

The individual IGBTs $13_1$-$13_m$ can be integrated in one common semiconductor body (semiconductor chip), or can be integrated in two or more separate semiconductor bodies (semiconductor chips). It is also possible to integrate each of the IGBTs $13_1$-$13_m$ in one separate semiconductor chip.

One operation mode of the bipolar transistor circuit 40 of FIG. 1 is explained below. For explanation purposes it is assumed that the individual IGBTs $13_1$-$13_m$ have the same chip size, so that they have the same current rating.

When the IGBTs $13_1$-$13_m$ are switched on, conduction losses occur. The conduction losses that occur at a given load current I through the bipolar transistor circuit 40 are, inter alia, dependent on the number of IGBTs $13_1$-$13_m$ connected in parallel, wherein the conduction losses decrease as the number of IGBTs $13_1$-$13_m$ increases. An increase of the number of IGBTs $13_1$-$13_m$ results in an increase of the overall chip size, which is the sum of the chip sizes of the individual IGBTs $13_1$-$13_m$.

However, an increase of the chip size may result in an increase of switching losses. Switching losses occur in each of the IGBTs $13_1$-$13_m$ when an operation state of the IGBT changes from an on state to an off state. This is explained with reference to the jth IGBT $13_j$ of the plurality of IGBTs $13_1$-$13_m$ in the following. When the IGBT jth $13_j$ is in the on state and conducts a portion of the load current I, a charge carrier plasma including electrons and holes is present in semiconductor regions of the IGBT $13_j$. When the jth IGBT $13_j$ is switched off, the electrical charge (reverse recovery charge) resulting from this plasma is removed from the IGBT $13_j$. The removal of the charge carrier plasma causes a reverse recovery current to flow from the jth IGBT $13_j$. Losses that occur in the jth IGBT $13_j$ (and an optional further device that is going to take over the current from the IGBT $13_j$) in connection with the reverse recovery process are defined by the reverse recovery current multiplied by the voltage across the IGBT $13_j$ (and the further device) during the reverse recovery process. The "further device" (not shown in FIG. 1) is, e.g., a freewheeling element, such as a diode, connected in parallel with the IGBT $13_j$. This is explained in further detail herein below. The losses in the jth IGBT $13_j$ increase towards the end of the reverse recovery process, when the reverse recovery current is still high and when the voltage across the IGBT $13_j$ has already increased. The time integral of these losses equals the energy that is dissipated in the jth IGBT $13_j$ in each switching process. The reverse recovery charge stored in each of the IGBTs $13_1$-$13_m$ is dependent on the chip size of each IGBT $13_1$-$13_m$ and on the current I through each IGBT $13_1$-$13_m$, wherein at a given current I the stored reverse recovery charge increases as the chip size increases.

In the bipolar transistor circuit 40 of FIG. 1, the overall losses which include conduction losses and switching losses can be minimized by suitably activating and deactivating individual ones of the IGBTs $13_1$-$13_m$ during one switching cycle. One switching cycle includes two subsequent time periods, namely a first time period $T_{on}$ and a second time period $T_{off}$ that are explained in further detail below. In general, as switching losses occur during transitions of the IGBTs $13_1$-$13_m$ from the on-state to the off-state, some of the plurality of IGBTs $13_1$-$13_m$ may initially be switched on at the beginning of the first time period $T_{on}$ and may subsequently be switched off at the end of the first time period $T_{on}$. Others of the plurality of IGBTs $13_1$-$13_m$ may also initially be switched on at the beginning of the first time period $T_{on}$ and may be switched off before the end of the first time period $T_{on}$. However, at least one of the IGBTs $13_1$-$13_m$ is switched off at the end of the first time period $T_{on}$.

When one of the IGBTs $13_1$-$13_m$ is switched off before the end of the first time period $T_{on}$ while at least another one of the plurality of IGBTs $13_1$-$13_m$ is still switched on, the voltage across the switched off IGBT, at maximum, corresponds to the voltage across the IGBT that is still switched on, wherein there is not yet a current flowing through the corresponding further device that is going to take over the current after the IGBT has switched off. The charge stored in the switched off IGBT is removed from this IGBT at a relatively low voltage, namely the voltage across the switched on IGBT. Thus, switching losses occurring in the switched off IGBT before the end of the first time period $T_{on}$ are lower than switching losses that would occur in this switched off IGBT and the corresponding further device when the IGBT would not be switched off early, but would be switched off at the end of the first time period $T_{on}$, which is at the same time as the last one of the plurality of IGBTs $13_1$-$13_m$ is switched off. The difference between the switching losses that actually occur in the switched off IGBT and the switching losses that would occur if the IGBT would be switched off at the end of the first time period $T_{on}$ are referred to as gain of the switching losses in the following.

In the bipolar transistor circuit 40, the voltage across the IGBTs that are kept in the on-state increases when at least one of the IGBTs is switched off. This results in an increase of conduction losses in the bipolar transistor circuit 40. However, in particular when the at least one IGBT is switched off a relatively short time before the end of the first time period $T_{on}$, this increase of conduction losses is smaller than the gain of switching losses obtained by early switch off of the at least one of the IGBTs.

In this way, the active chip size may be optimized in terms of conduction losses and switching losses. At the beginning of the first time period $T_{on}$, a first group of the plurality of IGBTs $13_1$-$13_m$ is switched on. This first group may include the overall number m of IGBTs or may include less than the overall number m, but is at least one (1). From this first group of IGBTs at least one IGBT is switched off before the end of the first time period $T_{on}$. Thus, there are two subgroups of IGBTs, namely a first subgroup of IGBTs that are switched on during the entire first time period $T_{on}$ and a second subgroup of IGBTs that are switched off before the end of the first time period $T_{on}$.

Referring to FIG. 1, the drive circuit 30 receives an input signal $S_{in}$. The input signal $S_{in}$ may assume a first signal level (on-level) or a second signal level (off-level). The on-level can be a high level and the off-level can be a low level, or vice versa. According to one embodiment, the input signal $S_{in}$ is a PWM (pulse-width modulated) signal which alternates between the on-level and the off-level.

Figure 2:
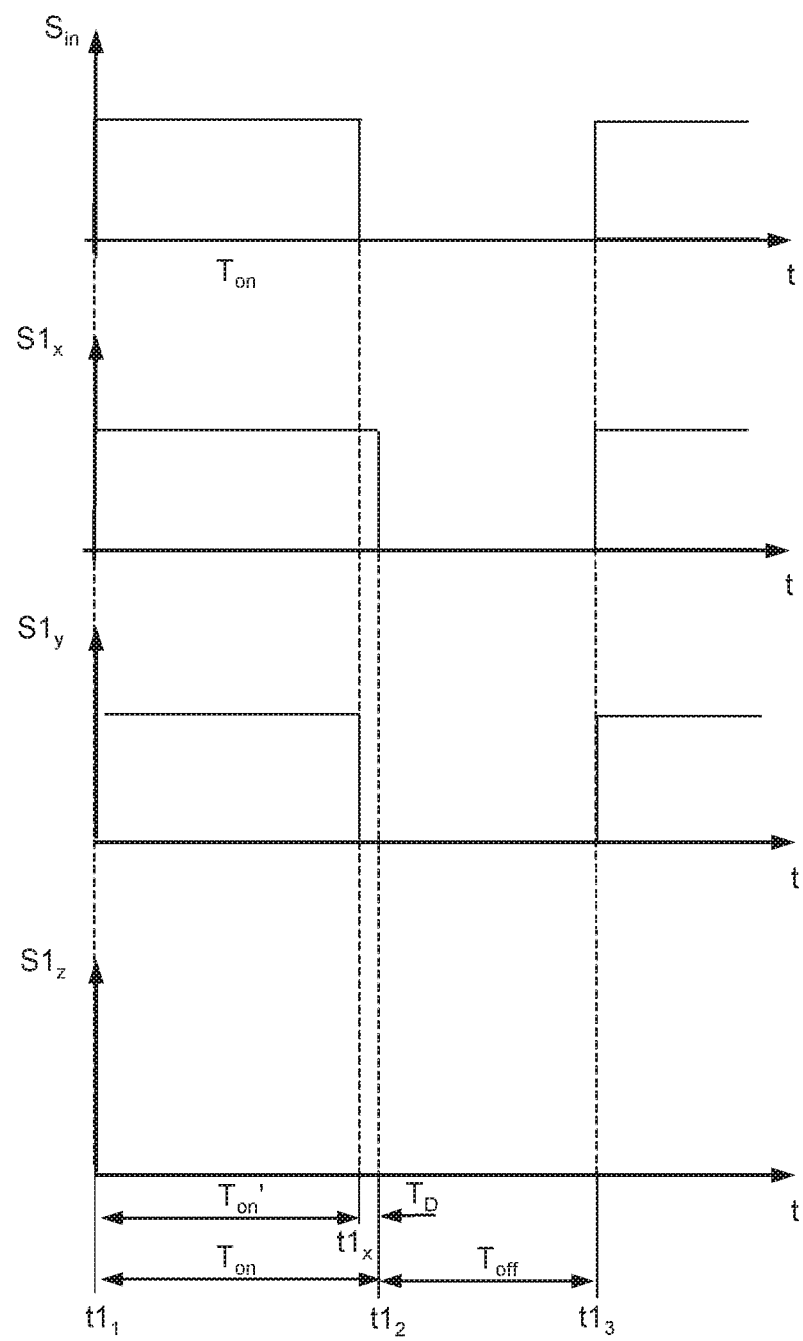
FIG. 2 shows timing diagrams illustrating one operation mode of the circuit according to FIG. 1.

Referring to FIG. 2, that shows timing diagrams of the input signal $S_{in}$ and of drive signals $S1_x$, $S1_y$, $S1_z$ of three different IGBTs of the bipolar transistor circuit 40, one switching cycle starts, when the input signal $S_{in}$ assumes the first level at a first time $t1_1$.

Referring to the explanation above, there is a first group of IGBTs that are switched on at the beginning of one switching cycle. This first group of IGBTs includes two subgroups, namely a first subgroup with at least one IGBT that is switched on for a first time period; and a second subgroup with at least one IGBT that is switched on simultaneously with the at least one IGBT of the first subgroup and switched off before the end of the first time period $T_{on}$. Optionally, there is a second group with at least one IGBT that is not switched during the switching cycle. In FIG. 2, drive signal $S1_x$ represents the drive signal of the at least one IGBT of the first subgroup, drive signal $S1_y$ represents the drive signal of the at least one IGBT of the second subgroup, and drive signal $S1_z$ represents the drive signal of the at least one IGBT of the optional second group. In the embodiment of FIG. 2, a high signal level represents an on-level of the corresponding drive signal $S1_x$, $S1_y$, and $S1_z$, respectively, and a low signal level represents an off-level of the corresponding drive signal $S1_x$, $S1_y$, and $S1_z$, respectively.

In the embodiment shown in FIG. 2, the IGBTs of the first group (that is the IGBTs of the first and second subgroups) are switched in accordance with the input signal $S_{IN}$, that is when the input signal assumes the on-level. In one switching cycle, the at least one IGBT (driven by signal $S1_x$) of the first subgroup is switched off at the end of the first time period $T_{on}$ which is at a time $t1_2$ in the embodiment shown in FIG. 2, and the at least one IGBT (driven by signal $S1_y$) of the second subgroup is switched off before the end of the first time period $T_{on}$ at a time $t1_x$ in the embodiment shown in FIG. 2. Referring to FIG. 2, the switch-off time of the at least one IGBT of the second subgroup can be defined by the input signal $S_{IN}$ such that the at least one IGBT of the second subgroup switches off when the input signal $S_{in}$ changes from the on-level to an off-level. It should be noted that inevitable delay times resulting from propagation delays in the drive circuit (30 in FIG. 1) and that may cause the at least one IGBT of the second subgroup to switch slightly after the input signal $S_{in}$ assumes the off-level are not reflected in the illustration of FIG. 2. In FIG. 2, $T_{on}'$ denotes the time period for which the input signal $S_{in}$ has the on-level, wherein this time period is shorter than the first time period $T_{on}$.

The switch-off time of the at least one IGBT of the first subgroup, that is the end of the first time period $T_{on}$, can be defined by the input signal $S_{in}$ such that at least one IGBT of the first subgroup switches off after a delay time $T_D$ after the input signal $S_{in}$ switches to the off-level. In this case, the delay time $T_D$ corresponds to the time period for which the at least one IGBT of the second subgroup switches off before the end of the first time period $T_{on}$, that is before the least one IGBT of the first subgroup switches off.

Referring to FIG. 2, a switching cycle includes a second time period $T_{off}$ (off-period) that starts at the end of the first time period $T_{on}$. During the second time period $T_{off}$ each of the IGBTs of the first group is in an off-state. The switching cycle ends and a new switching cycle starts at the end of the second time period $T_{off}$.

The number of IGBTs of the bipolar transistor circuit 40 that are activated at the beginning of the first time period $T_{on}$, that is the number of the first group, may vary dependent on a load condition of the bipolar transistor circuit 40. That is, there may be a second group of IGBTs that are not switched on at all during the first time period $T_{on}$, wherein the number of IGBTs of this second group may vary dependent on a load condition of the bipolar transistor circuit 40. Let m be the overall number of IGBTs in the bipolar transistor circuit 40, with:

$$m=m1+m2 \quad (1)$$

where m1≥1 and m2≥0, and $$m1=m11+m12 \quad (2),$$

where m11≥1 and m12≥1, and where m1 is the number of IGBTs of the first group, m2 is the number of IGBTs of the optional second group, m11 is the number of IGBTs of the first subgroup and m12 is the number of IGBTs of the second subgroup. The number of IGBTs switched on at the beginning of the first time period corresponds to m11+m12, where m12 IGBTs are switched off before the end of the first time period and m11 IGBTs are switched on throughout the first time period.

According to one embodiment, the load condition is represented by the load current I through the bipolar transistor circuit 40 when at least one of the IGBTs is switched on. In this embodiment, the drive circuit 30 receives a current signal $S_I$ representing the load current I and selects the first number m1 dependent on the current signal $S_I$. According to one embodiment, the drive circuit 30 is configured to evaluate the current signal $S_I$ in one drive cycle and to adjust the first number m1 of IGBTs that are switched on in a following drive cycle dependent on the evaluated current signal $S_I$. According to one embodiment, the first number m1 of IGBTs that are switched on at the beginning of the first time period $T_{on}$ decreases as the load current I decreases.

Equivalently, the number m12 of IGBTs of the second subgroup may be adjusted dependent on the current signal $S_I$, wherein this number may increase as the current I decreases. This is equivalent to a decrease of the number of IGBTs of the first subgroup when the load current decreases.

The selection of IGBTs that belong to the first group and to the optional second group as well as the selection of IGBTs that belong to the first subgroup and to the second subgroup may change with every drive cycle, or may change after several drive cycles. Especially in operation scenarios in which there is a second group with at least one IGBT that is not activated at all, this may help to more equally distribute the losses amongst the IGBTs $13_1$-$13_m$, because the selection of the at least one IGBT belonging to the second group may change from time to time.

Each of the first group and the optional second group as well as the first subgroup and the second subgroup represents a chip size which is the sum of the chip sizes of the IGBTs in the individual (sub)groups. In this case, the drive circuit 30 may not only select the number of IGBTs in the first and second groups and the first and second subgroups, respectively, dependent on the current signal $S_I$, but may select the IGBTs of the first and second groups such that the chip size represented by the first group increases as the load current increases. Equivalently, the chip size represented by the second subgroup may increase as the load current decreases. That is a higher amount of chip size is deactivated before the end of the first time period when the load current decreases.

According to a further embodiment, at the beginning of the first time period only the transistors of the first subgroup are switched on, while the transistors of the second subgroup are kept switched off during the first time period. In this embodiment, the first group includes the plurality of transistors and there is no second group.

Figure 3:
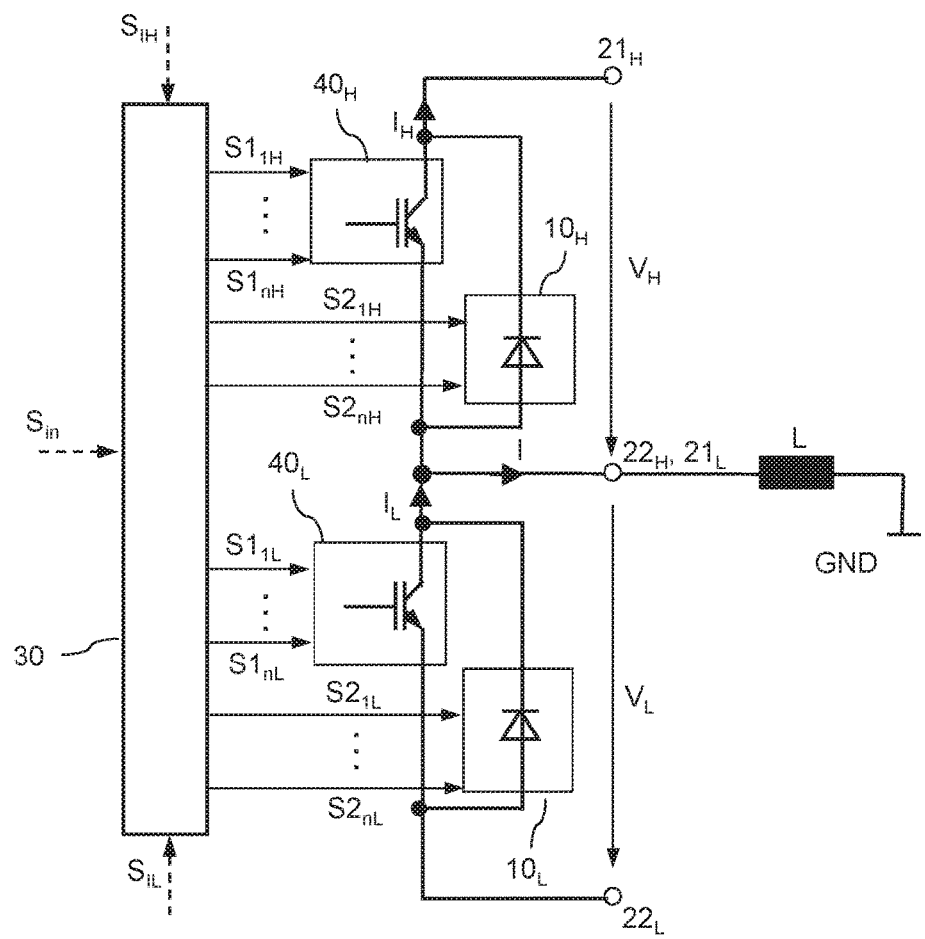
FIG. 3 illustrates one embodiment of an application circuit including the bipolar transistor circuit of FIG. 1.

FIG. 3 schematically illustrates an application circuit that includes a first bipolar transistor circuit $40_H$ and a second bipolar transistor circuit $40_L$ for driving a load L. The first and second bipolar transistor circuits $40_H$, $40_L$ are only schematically illustrated as circuit blocks in FIG. 3, and may each be implemented in accordance with the bipolar transistor circuit 40 as explained with reference to FIG. 1 herein before, or as explained with reference to FIGS. 8 and 10 below. That is, each of the first and second bipolar transistor circuits $40_H$, $40_L$ includes a plurality of IGBTs, wherein each of these IGBTs has a drive terminal and a load path. The load paths of the IGBTs in the first bipolar transistor circuit $40_H$ are connected between a first circuit node $21_H$ and a second circuit node $22_H$, and the load paths of the IGBTs in the second bipolar transistor circuit $40_L$ are connected between a third circuit node $21_L$ and a fourth circuit node $22_L$.

Referring to FIG. 3, the first bipolar transistor circuit $40_H$ and the second bipolar transistor circuit $40_L$ form a half-bridge circuit. That is, the load paths of the IGBTs of the first bipolar transistor circuit $40_H$ and the load paths of the IGBTs of the second bipolar transistor circuit $40_L$ are connected in series with each other between the first and fourth circuit nodes $21_H$ and $22_L$. The second and third circuit nodes $22_H$, $21_L$ are connected and form an output of the half-bridge for connecting a load thereto. The first circuit node $21_H$ is configured to receive a first supply potential, and the fourth circuit node $22_L$ is configured to receive a second supply potential. The first supply potential may be a positive supply potential, whereas the second supply potential may be a negative supply potential or a reference potential, such as ground, respectively.

The first bipolar transistor circuit $40_H$ is also referred to as high-side transistor circuit and the second bipolar transistor circuit $40_L$ as low-side transistor circuit in the following.

In FIG. 3, one IGBT in each of the first and second bipolar transistor circuits $40_H$, $40_L$ is schematically illustrated. The IGBTs of the first and second bipolar transistor circuits $40_H$, $40_L$, respectively, are connected as illustrated in FIG. 3. That is, emitter terminals of IGBTs in the first bipolar transistor circuit $40_H$ are connected to the output $21_L$, $22_H$, and emitter terminals of IGBTs in the second bipolar transistor circuit $40_L$ are connected to the fourth circuit node $22_L$.

Referring to FIG. 3, a freewheeling circuit is connected in parallel with each of the load paths of the bipolar transistor circuits $40_H$, $40_L$. A first freewheeling circuit $10_H$ is connected in parallel with the load path of the high-side bipolar transistor circuit $40_H$ and a second freewheeling circuit $10_L$ is connected in parallel with the load path of the low-side bipolar transistor circuit $40_L$. The freewheeling circuits $10_H$, $10_L$ each include at least one rectifier element such as a diode. The at least one rectifier element in the first freewheeling circuit $10_H$ has a polarity such that the first freewheeling circuit $10_H$ blocks when a voltage $V_H$ between the first and second circuit nodes $21_H$, $22_H$ is a positive voltage (that is, when the voltage $V_H$ has a polarity as indicated in FIG. 3), and conducts when the voltage $V_H$ between the first and second circuit nodes $21_H$, $22_H$ is a negative voltage. Equivalently, the at least one rectifier element in the second freewheeling circuit $10_L$ has a polarity such that the second freewheeling circuit $10_L$ blocks when a voltage $V_L$ between the third and fourth circuit nodes $21_L$, $22_L$ is a positive voltage (that is, when the voltage $V_L$ has a polarity as indicated in FIG. 3), and conducts when the voltage $V_L$ between the third and fourth circuit nodes $21_L$, $22_L$ is a negative voltage.

Referring to FIG. 3, a load L such as an inductive load may be connected to the output node $21_L$, $22_H$ of the half-bridge circuit. This load L can be driven in a PWM fashion by switching on and off the high-side transistor circuit $40_H$ in a PWM fashion and by switching on and off the low-side transistor circuit $40_L$ complementary to the high-side transistor circuit $40_H$. That is, the low-side transistor circuit $40_L$ is switched off when the high-side transistor circuit $40_H$ is switched on, and the low-side transistor circuit $40_L$ is switched on when the high-side transistor circuit $40_H$ is switched off. In order to prevent cross currents there may be a delay time (dead time) between switching off one of the high-side transistor circuit $40_H$ and the low-side transistor circuit $40_L$ and switching on the other one of the high-side transistor circuit $40_H$ and the low-side transistor circuit $40_L$. During this delay time one of the freewheeling circuits $10_H$, $10_L$ takes the current through the (inductive) load.

A drive circuit 30 controls the operation of the high-side transistor circuit $40_H$, the low-side transistor circuit $40_L$ and the freewheeling circuits $10_H$, $10_L$ in the embodiment of FIG. 3. The freewheeling circuits $10_H$, $10_L$ are only illustrated as a circuit block in FIG. 3, and can be implemented in different ways. Some embodiments for implementing these freewheeling circuits $10_H$, $10_L$ are explained with reference to FIGS. 4, 5, 7 and 9 herein below.

Figure 4:
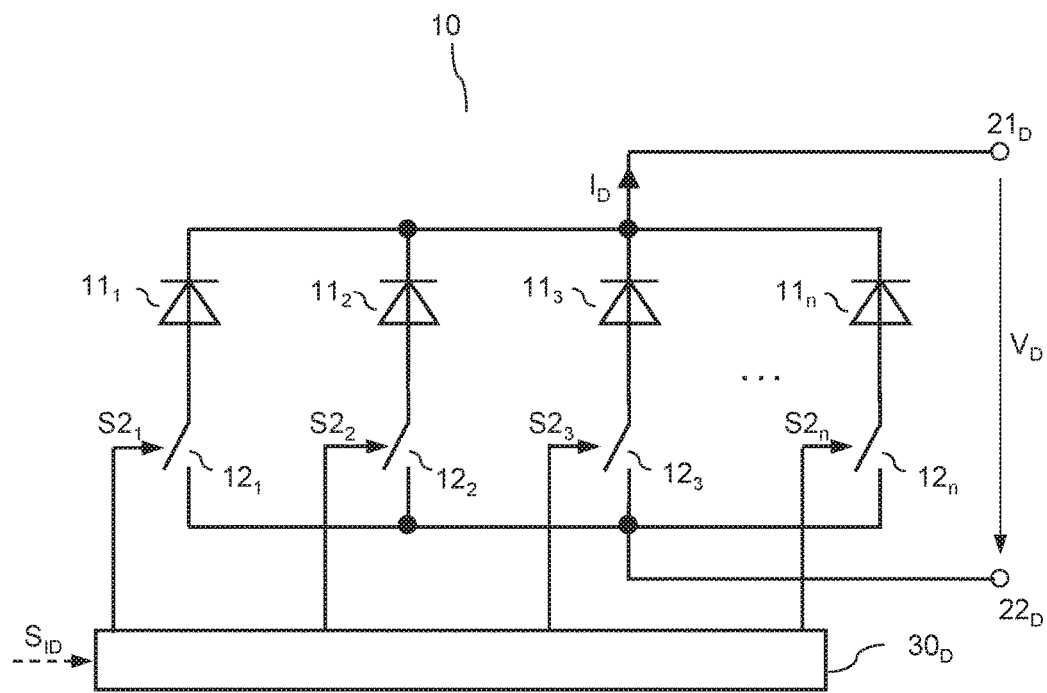
FIG. 4 illustrates one embodiment of a circuit including a plurality of diodes.

FIG. 4 illustrates a first embodiment of a freewheeling circuit 10 that can be used to implement one of the first and second freewheeling circuits $10_H$, $10_L$ shown in FIG. 3. The freewheeling circuit 10 shown in FIG. 4 includes a plurality of n, with n≥2, diodes $11_1$-$11_n$ and is referred to as diode circuit in the following. The individual diodes $11_1$-$11_n$ are connected in parallel between a first node $21_D$ and a second node $22_D$. In the embodiment of FIG. 4, n=4 diodes are shown. However, this is only an example. The overall number of diodes $11_1$-$11_n$ may vary dependent on the specific application where the diode circuit 10 is employed. In the present embodiment, the diodes $11_1$-$11_n$ have their cathode coupled to the first node $21_D$ and have their anode coupled to the second node $22_D$.

The nodes $21_D$, $22_D$ are configured to receive a voltage. This voltage V can have one of a first polarity and a second polarity. The first polarity forward biases the diodes $11_1$-$11_n$, while the second polarity reverse biases the diodes $11_1$-$11_n$. A voltage level of the voltage V with the first polarity is also referred to as first voltage level V1 and a voltage level with the second polarity is also referred to as second voltage level V2 in the following.

In the embodiment of FIG. 4, the individual diodes $11_1$-$11_n$ can be activated and deactivated independent of each other. For this, a respective switch $12_1$, $12_2$, $12_3$, $12_n$ is connected in series with each of the diodes $11_1$-$11_n$. A drive circuit $30_D$ is configured to output drive signals $S_1$, $S_2$, $S_3$, $S_n$ that switch the individual switches $12_1$-$12_n$ on and off. The operating principle of the drive circuit $30_D$ is explained below. Each of the plurality of diodes $11_1$-$11_n$ is activated when the corresponding switch $12_1$-$12_n$ connected in series therewith is switched on (is in an on-state) and is deactivated when the corresponding switch $12_1$-$12_n$ connected in series therewith is switched off (is in an off-state). The individual diodes $11_1$-$11_n$ can be integrated in one common semiconductor chip, or can be integrated in two or more separate semiconductor chips. It is also possible to integrate each of the diodes $11_1$-$11_n$ in a separate semiconductor chip.

The possibility to activate and deactivate each of the plurality of diodes $11_1$-$11_n$ independently is only an example. According to a further embodiment at least one of the diodes $11_1$-$11_n$ is always activated. And according to yet another embodiment at least two of the diodes $11_1$-$11_n$ are activated and deactivated together. An embodiment of a diode circuit 10 in which both of these options are implemented is illustrated in FIG. 5.

Figure 5:
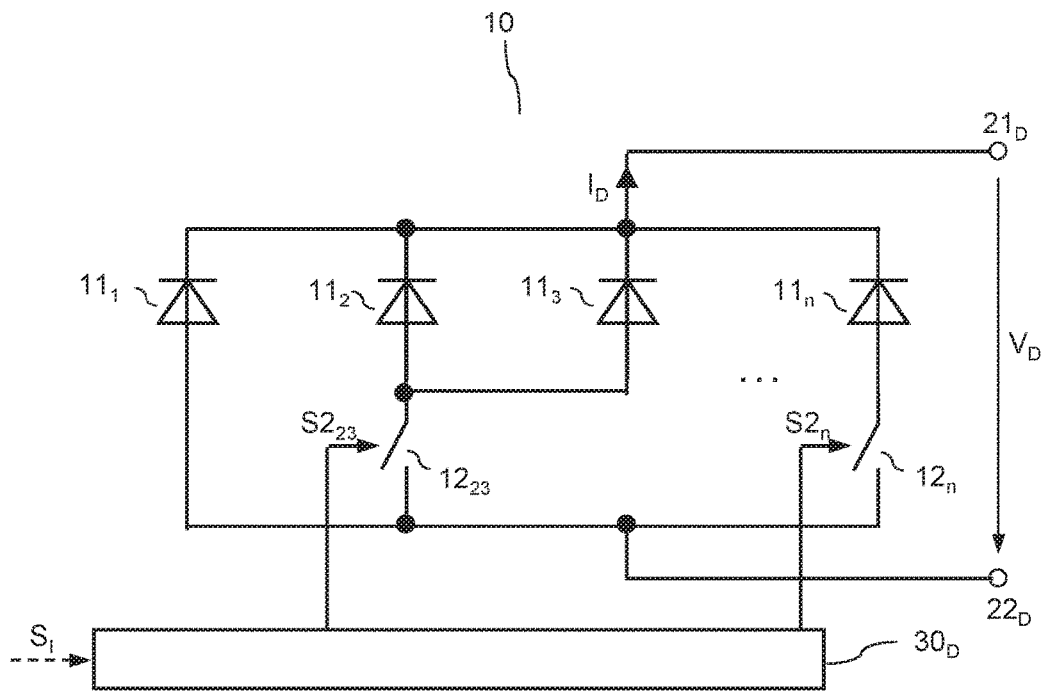
FIG. 5 illustrates a modification of the diode circuit of FIG. 4.

In the diode circuit 10 of FIG. 5, a first diode $11_1$ is permanently activated. That is, the first diode $11_1$ has its cathode directly connected to the first node $21_D$ and its anode directly connected to the second node $22_D$ so that there is no switch between the first diode $11_1$ and one of these nodes $21_D$, $22_D$. A second diode $11_2$ and a third diode $11_3$ are connected to the nodes $21_D$, $21_D$ via a common switch $12_{23}$ that activates or deactivates both of the second and third diodes $11_2$, $11_3$.

The operating principle of the diode circuits 10 of FIGS. 4 and 5 is explained below. For explanation purposes it is first assumed that each of the diodes $11_1$-$11_n$ is activated. That is, each of the diodes $11_1$-$11_n$ is capable of conducting a current when the first voltage level V1 is applied to the nodes $21_D$, $22_D$. Just for explanation purposes it is further assumed that the individual diodes $11_1$-$11_n$ have the same chip size, so that they have the same current rating.

When the diodes $11_1$-$11_n$ are forward biased, conduction losses occur. At a given load current $I_D$ through the parallel circuit with the diodes $11_1$-$11_n$ these conduction losses can be decreased by increasing the number of diodes $11_1$-$11_n$ of the diode circuit 10, that is, by increasing the overall chip size. The overall chip size is the sum of the chip sizes of the individual diodes $11_1$-$11_n$.

However, an increase of the chip size may result in an increase of commutation losses. Commutation losses occur in each of the diodes $11_1$-$11_n$, when an operation state of the corresponding diode changes from a forward biased state to a reverse biased state, that is when the voltage V changes from the first voltage level V1 to the second voltage level V2. This is explained with reference to the jth diode $11_j$ of the plurality of diodes in the following. When the jth diode $11_j$ is forward biased and conducts a portion of the current I, a charge carrier plasma including electrons and holes is present in semiconductor regions of the diode $11_j$. When the jth diode $11_j$ is reverse biased, the electrical charge (reverse recovery charge) resulting from this plasma is removed from the diode $11_j$. The removal of the charge carrier plasma causes a reverse recovery current (often referred to as $I_{RR}$) to flow from the jth diode $11_j$. Losses that occur in the jth diode $11_j$ in connection with the reverse recovery process are defined by the reverse recovery current multiplied by the voltage across the diode $11_j$ during the reverse recovery process. These losses in the jth diode $11_j$ increase towards the end of the reverse recovery process, when the reverse recovery current is still high and when the voltage across the diode $11_j$ has already increased. The time integral of these losses equals the energy that is dissipated in the diode $11_j$ each switching process. The reverse recovery charge stored in each of the diodes $11_1$-$11_n$ for a fixed current I is dependent on the chip size and the current through each of the diodes $11_1$-$11_n$, wherein at a given current the reverse recovery charge increases as the chip size increases.

Further, losses resulting from the reverse recovery current of one diode may occur in a device that takes over the current from the diode. Assume, for example, that in the circuit according to FIG. 3 the high-side transistor circuit $40_H$ and the low-side transistor circuit $40_L$ are switched on and off alternatingly and that there is a dead time between switching off one of the high-side transistor circuit $40_H$ and the low-side transistor circuit $40_L$ and switching on the other one of the high-side transistor circuit $40_H$ and the low-side transistor circuit $40_L$. When, for example, the low-side transistor circuit $40_L$ has been switched off the diode circuit $10_L$ connected in parallel with the low-side transistor circuit $40_L$ takes over the load current I through the inductive load L. When the high-side transistor circuit $40_H$ switches on, the current $I_L$ through the diode circuit $10_L$ decreases and the current through the high-side transistor circuit $40_H$ (that flows in a direction opposite the direction indicated in FIG. 3) increases. Towards the end of this process a reverse recovery current flows through the diode circuit $10_L$ in a direction opposite the direction of the current $I_L$ shown in FIG. 3. This reverse recovery current additionally to the load current I flows through the high-side transistor circuit $40_H$. However, the voltage across the high-side transistor circuit $40_H$ may still be relatively high at the time when the reverse recovery current in the diode circuit $10_L$ occurs as the high-side transistor circuit $40_H$ may not yet have completely switched on at this time. Thus, the reverse recovery current may cause relatively high losses in the high-side transistor circuit $40_H$ that is about to take over the load current I from the diode circuit $10_L$.

In the diode circuits 10 of FIGS. 4 and 5, the overall losses which include conduction losses and switching losses can be minimized by suitably activating and deactivating individual ones of the diodes $11_1$-$11_n$ during the commutation process. This process includes two subsequent time periods, namely an on-time when the voltage V has the first voltage level V1 and when it is desired for at least one of the diodes $11_1$-$11_n$ to conduct a current, and an off-time when the voltage V has the second voltage level V2 and when it is desired to have no current flow between the nodes 21, 22. In general, as commutation losses occur during the transition of the diodes $11_1$-$11_n$ from the forward biased state (on-state) to the reverse biased state (blocking state), some of the plurality of diodes $11_1$-$11_n$ may be activated at the beginning of the on-time and may be deactivated before the transition takes place. However, at least one of the diodes $11_1$-$11_n$ is kept activated.

For example, in the embodiment shown in FIG. 4, some diodes of the diode circuit $10_L$ may be deactivated before the high-side transistor circuit $40_H$ conducts a current. There is an inevitable delay time between a time when at least one drive signal $S1_{1H}$-$S1_{nH}$ assumes an on-level and a time when the high-side transistor circuit $40_H$ (at least one transistor in the high-side transistor circuit $40_H$) starts to conduct. This delay time corresponds to the time that is required to charge an internal gate-source capacitance of the at least one transistor to a threshold voltage at which the at least one transistor starts to conduct.

When one of the diodes $11_1$-$11_n$ is deactivated while at least another one of the plurality of diodes $11_1$-$11_n$ is still activated, the voltage across the deactivated diode(s), at maximum, corresponds to the voltage across the diode that is still forward biased. The charge stored in the deactivated diode decreases, as the current through the diode decreases to zero. Thus, a first amount of switching losses occurring in the diode that is deactivated before a reverse biasing voltage is applied to the nodes 21, 22 is lower than a second amount of switching losses that would occur in this diode if the diode was not deactivated, but instead reverse biased through the voltage V between the nodes 21, 22. The difference between the first amount and the second amount is referred to as gain of the switching losses in the following.

In the diode circuit 10, the voltage across the activated diodes increases when at least one of the diodes is deactivated. This results in an increase of conduction losses in the diode circuit 10 after the deactivation. However, in particular when the at least one diode is deactivated relatively short before the end of the on-time, this increase of conduction losses is smaller than the gain of commutation losses obtained by early deactivating the at least one of the diodes.

In this way, the active chip size may be optimized in terms of conduction losses and commutation losses. At the beginning of the on-time, a first number of diodes $11_1$-$11_n$ is activated. This first number may correspond to the overall number n or may be less than the overall number, but is at least one (1). From this number of diodes at least one diode is deactivated before the end of the on-time. Thus, there are two groups of diodes, namely a first group of diodes that are permanently activated during the on-time, and a second group of diodes that are deactivated before the end of the on-time. The first group may include diodes that cannot be deactivated (e.g., because there is no switch connected in series therewith) or diodes that can be activated and deactivated and that are permanently activated during the on-time.

According to a further embodiment, the diodes of the second group are not activated at all during the on-time. That is, these diodes are kept deactivated during the on-time, while only the diodes of the first group are activated.

Figure 6:
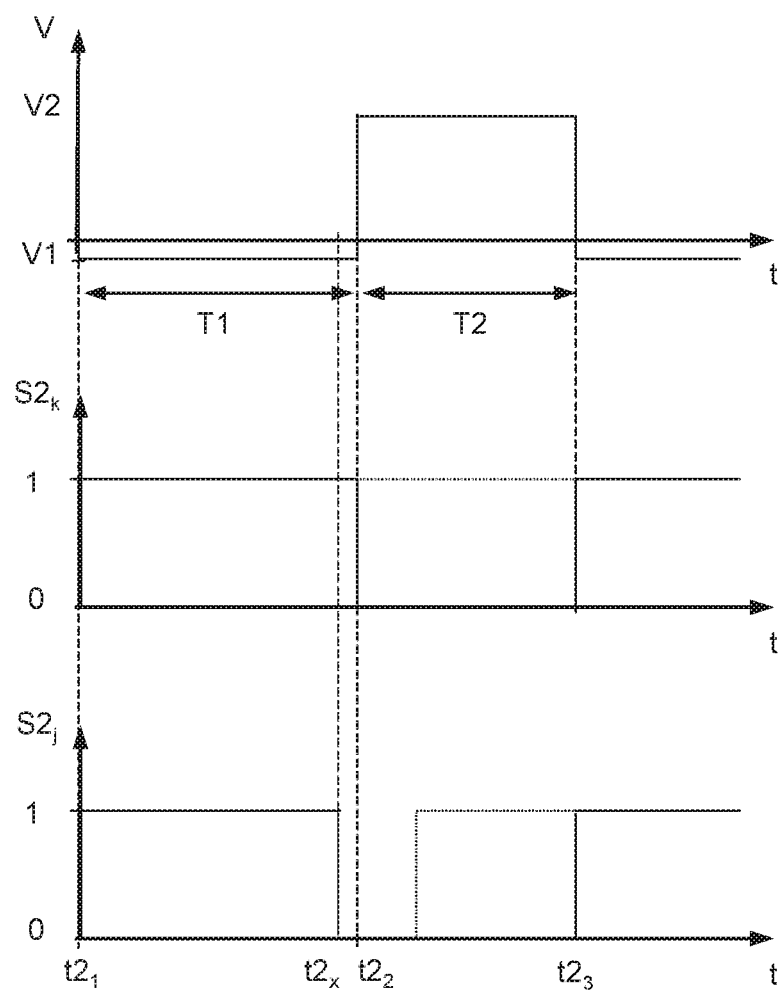
FIG. 6 shows timing diagrams illustrating one operation mode of the circuit according to FIG. 4.

FIG. 6 shows timing diagrams that illustrate the operating principle of the diode circuits 10 shown in FIGS. 4 and 5. In FIG. 6, the timing diagram of the voltage V applied between the first node $21_D$ and the second node $22_D$ and the activation states of the diodes of the first group and the second group are shown. The activation state of the diodes of the first group is represented by one drive signal $S2_k$ that activates or deactivates at least one of the diodes of this group, and the activation state of the diodes of the second group is represented by one drive signal $S2_j$ that activates or deactivates at least one of the diodes of this group. For explanation purposes it is assumed that the corresponding diode is activated when the drive signal $S2_j$, $S2_k$ has a high level (logic "1" level) and is deactivated when the drive signal has a low level (logic "0" level).

In FIG. 6, T1 denotes the on-time that lasts from a first time instant t2$_1$ to a second time instant t2$_2$. During the on-time T1, the voltage V applied between the first node 21 and the second node 22 has the first voltage level V1 that forward biases those diodes of the plurality of diodes $11_1$-$11_n$ that are activated. T2 denotes the off-time between the second time instant t2$_2$ and a third time instant t2$_3$. During the off-time T2 the voltage V applied between the first node 21 and the second node 22 has the second voltage level V2 that reverse biases those diodes of the plurality of diodes $11_1$-$11_n$ that are activated. The voltage V is only schematically illustrated in FIG. 6. In a real circuit, of course, the slopes of the voltage V are not vertical (as illustrated in FIG. 6).

Referring to FIG. 6, the second group of diodes is activated for most of the on-time T1. However, at a time instant t2$_x$, just before the end of the on-time T1, the at least one diode of the second group is deactivated (indicated by the drive signal $S2_j$ going low at time t2$_x$ in FIG. 6), while the at least one diode of the first group is still activated.

According to one embodiment, a time difference between the time t2$_x$ when the at least one diode of the second group is deactivated and the time t2$_2$ when the diode circuit 10 is reverse biased is between one and five times the carrier lifetime of charge carriers in the diodes. In particular, this time difference may be between 1 microseconds (μs) and 10 μs.

In the embodiment of FIG. 6, a new operation cycle starts at time t2$_3$ when the voltage V again assumes the first level V1 that forward biases the diode circuit 10. At this time, the diodes of the first group and of the second group are again activated. Different from the illustration in FIG. 6, the activation could also take place at an earlier time between t2$_2$ and t2$_3$. This is illustrated in dotted lines in case of the drive signal $S2_j$ in FIG. 6.

In the embodiment illustrated in FIG. 6, the at least one diode of the first group is deactivated (at time t2$_2$) when the voltage V reverse biases the diode circuit 10. However, this is only an example. It is also possible to keep the at least one diode of the first group permanently activated. This is illustrated in dotted lines in FIG. 6. In this case, an activation and deactivation circuit of the at least one diode of the first group can be omitted.

The deactivation of the at least one diode of the second group before the voltage V reverse biases the diode circuit 10 requires beforehand an information about the time (t2$_2$ in FIG. 6) when the voltage V will reverse bias the diode circuit. Usually, the polarity of this voltage V is dependent on a control signal (drive signal) so that the information about the time when the voltage V reverse biases the diode circuit can be derived from this control signal. For example, in the circuit of FIG. 3, the polarity of the voltages $V_H$ and $V_L$ across the diode circuits $10_H$, $10_L$ is dependent on drive signals $S1_{1H}$-$S1_{nH}$, $S1_{1L}$-$S1_{nL}$ received by the high-side and low-side transistor circuits $40_H$, $40_L$, wherein these signals are dependent on the input signal $S_{in}$. According to one embodiment, the drive circuit 30 introduces a delay time between rising and falling edges of the input signal $S_{in}$ and corresponding rising and falling edges of at least some of the $S1_{1H}$-$S1_{nH}$, $S1_{1L}$-$S1_{nL}$ (e.g., as explained with reference to signals $S_{in}$ and $S1_x$ in FIG. 2). In this case, the information about the time when one of the high-side and low-side transistor circuits $40_H$, $40_L$ completely switches on or off (and causes the polarity of one of the voltages $V_H$, $V_L$) to change can be derived beforehand from the input signal $S_{in}$.

The selection of the diodes $11_1$-$11_n$ that belong to the first group and to the second group may change with every drive cycle, or may change after several drive cycles. Especially in operation scenarios in which there is at least one diode that is not activated at all, this may help to more equally distribute the losses amongst the diodes $11_1$-$11_n$, because the selection of the at least one diode that is not activated may change from time to time.

The number of diodes that are activated at the beginning of the on-time, that is the sum of the number of diodes of the first group and the number of diodes of the second group, may vary dependent on a load condition of the diode circuit 10. That is, there may be a further group of diodes that are not activated at all during the on-time, wherein the number of diodes of this further group may vary dependent on a load condition of the diode circuit 10. Let n be the overall number of diodes in the diode circuit, with:

$$n = n1 + n2 + n3 \qquad (1),$$

where n1 is the number of diodes of the first group, n2 is the number of diodes of the second group and n3 is the number of diodes of the further group. The number of diodes activated at the beginning of the on-time corresponds to n1+n2, where n1 diodes are activated throughout the on-time T1 (and optionally also throughout the off-time T2) and n2 diodes are deactivated before the end of the on-time T1.

According to one embodiment, the load condition is represented by the load current $I_D$ through the diode circuit 10 in the forward biased state. In this embodiment, the drive circuit $30_D$ receives the current signal $S_{ID}$ representing the load current $I_D$ and selects the first number dependent on the current signal $S_{ID}$. The drive circuit $30_D$ can be configured to evaluate the current signal $S_I$ in one drive cycle and to adjust the overall number of diodes that are activated in a following drive cycle dependent on the evaluated current signal $S_{ID}$. According to a further embodiment, the drive circuit $30_D$ is configured to adjust the number of activated diodes in one drive cycle. Equivalently, the number of diodes of the second group can be adjusted dependent on the current signal $S_{ID}$, wherein this number may increase as the current $I_D$ decreases. According to one embodiment, the overall number of diodes that are activated at the beginning of the on-time decreases as the load current $I_D$ decreases.

According to a further embodiment, all of the diodes $11_1$-$11_n$ are activated at the beginning of the on-time, while the number of the diodes of the first group is variable dependent on the current signal $S_{ID}$.

Each of the first group and the second group represents a chip size which is the sum of the chip sizes of the diodes in the individual group. According to one embodiment, the individual diodes have different chip sizes. In this case, the drive circuit $30_D$ may not only select the number of diodes in the first and second group dependent on the current signal $S_I$, but may select the diodes of the first and second group such that the chip size represented by the first group and of the chip size represented by the second group increases as the load current increases. Equivalently, the chip size represented by the second group may increase as the load decreases, that is, a higher amount of chip size is deactivated before the end of the on-time when the load current decreases.

The drive circuit $30_D$ can be configured to detect the beginning of the on-time T1 by evaluating the polarity of the voltage between the circuit nodes $21_D$, $22_D$. Of course, the diodes that are active at the beginning of the on-time can already be activated (e.g., by switching on the corresponding switch $12_1$-$12_n$) during the off-time preceding the on-time.

The diodes $11_1$-$11_n$ of the diode circuit 10 can be integrated in one semiconductor body. The diodes $11_1$-$11_n$ can then be isolated from each other by means of dielectric regions, for example.

Figure 7:
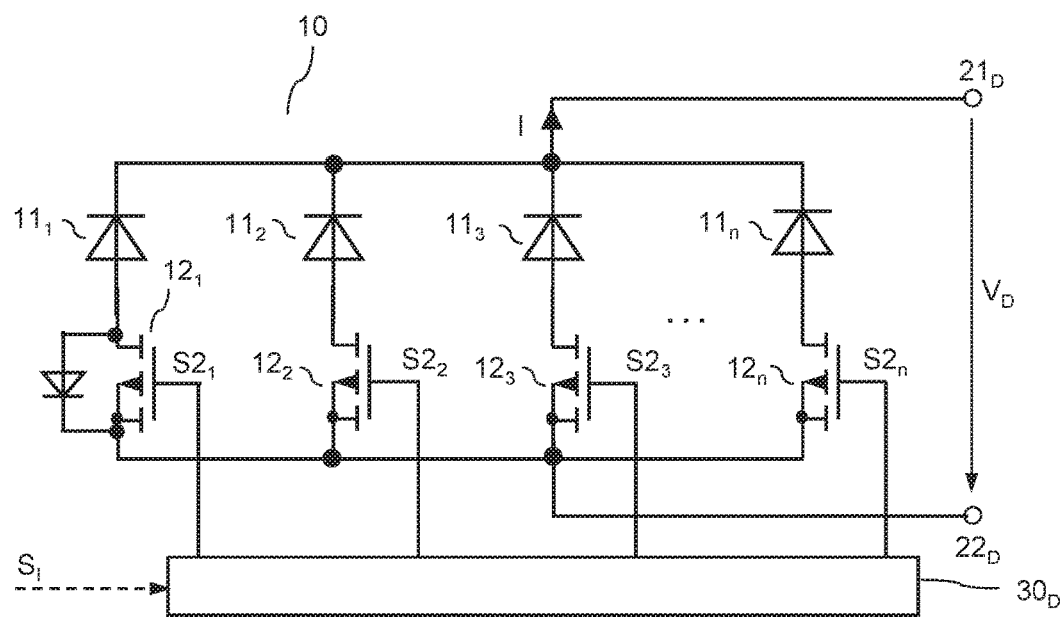
FIG. 7 illustrates one embodiment of a diode circuit.

Referring to FIG. 7, the switches $12_1$-$12_n$ for activating and deactivating the diodes $11_1$-$11_n$ can be MOS transistors, such as MOSFETs. In the embodiment shown in FIG. 7, the MOSFETs are p-type MOSFETs. However, any other type of MOSFET or any other type of switching device may be used instead.

The switches $12_1$-$12_n$ can be implemented with a relatively low voltage blocking capability. An arbitrary one of the individual switches $12_1$-$12_n$ blocks when the diode circuit 10 is forward biased and when the corresponding diode $11_1$-$11_n$ is to be deactivated. However, in this case at least one of the other diodes $11_1$-$11_n$ is activated so that the voltage between the nodes 21, 22, which corresponds to the voltage across the blocking switch, is essentially the forward voltage of the at least one forward biased diode. This voltage is about several volts, at most. Switches $12_1$-$12_n$ with a low voltage blocking capability, that may be used in the diode circuit 10, usually have a low on-resistance so that the switches $12_1$-$12_n$ in series with the diodes $11_1$-$11_n$ do not significantly increase the conduction losses of the diode circuit 10. Clamping diodes (not illustrated) such as Zener or Avalanche diodes may be connected in parallel to the switches in order to limit the voltages across the switches $12_1$-$12_n$.

When the diode circuit 10 is reverse biased, the diodes $11_1$-$11_n$ block the reverse biasing voltage and, therefore, protect the switches $12_1$-$12_n$. According to one embodiment, the switches $12_1$-$12_n$ are switched on when the diode circuit 10 is reverse biased. This helps to keep the voltage across the individual switches $12_1$-$12_n$ low and helps to protect the switches $12_1$-$12_n$. When the switches $12_1$-$12_n$ are implemented as MOSFETs that have their internal body diode connected back-to-back with the corresponding diode $11_1$-$11_n$, there is no need to switch on the switches $12_1$-$12_n$ when the diode circuit 10 is reverse biased. In this case, the body diode of each MOSFET clamps the voltage across the MOSFET to the forward voltage of the body diode. Referring to FIG. 7, a p-type MOSFET that has the drain terminal connected to the anode terminal of the corresponding diode (or that has the source terminal connected to the cathode terminal of the corresponding diode) has the internal body diode connected back-to-back with the corresponding diode.

Figure 8:
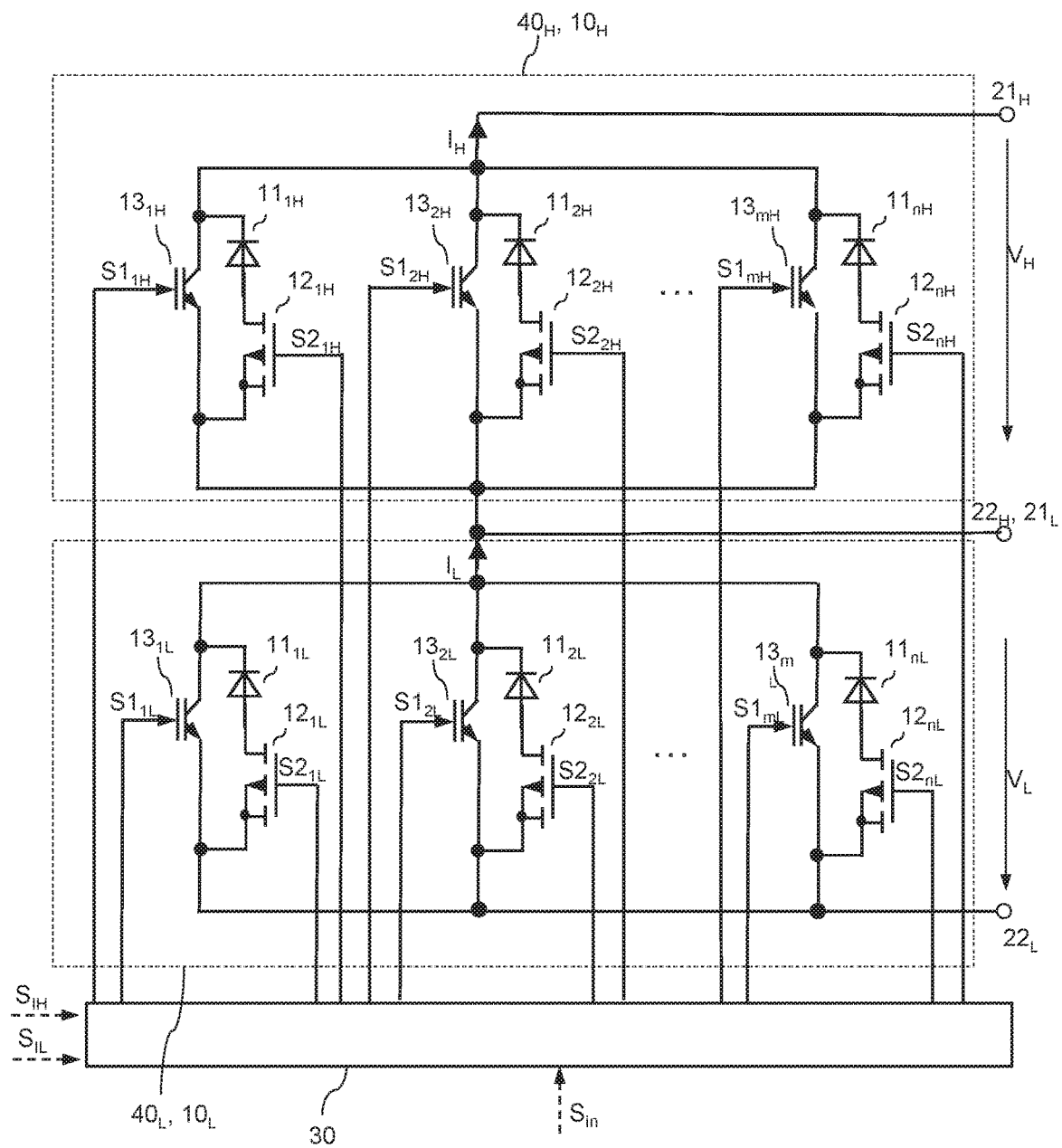
FIG. 8 illustrates one embodiment of the application circuit of FIG. 3.

FIG. 8 illustrates one embodiment of the application circuit of FIG. 3 in detail. In this circuit, the high-side transistor circuit $40_H$ includes a plurality of IGBTs $13_{1H}$-$13_{mH}$ that have their load paths (collector-emitter paths) connected in parallel with each other and connected between the first and second circuit nodes $21_H$, $22_H$. The low-side transistor circuit $40_L$ includes a plurality of IGBTs $13_{1L}$-$13_{mL}$ that have their load paths (collector-emitter paths) connected in parallel with each other and connected between the third and fourth circuit nodes $21_L$, $22_L$. The first and second freewheeling circuits $10_H$, $10_L$ are each implemented as explained with reference to FIG. 7 and each include a plurality of diodes $11_{1H}$-$11_{nH}$ and $11_{1L}$-$11_{nL}$, respectively, that can be activated and deactivated by switches each connected in series with one diode. However, these freewheeling circuits $10_H$, $10_L$ could be modified as explained in connection with FIGS. 4 to 7 explained before.

In the embodiment of FIG. 8, the number of diodes $11_{1H}$-$11_{nH}$ of the first freewheeling circuit $10_H$ corresponds to the number of IGBTs of the high-side transistor circuit $40_H$, and the number of diodes $11_{1L}$-$11_{nL}$ of the second freewheeling circuit $10_L$ corresponds to the number of IGBTs of the low-side transistor circuit $40_L$. However, this is only an example. The number of diodes $11_{1H}$-$11_{nH}$ of the first freewheeling circuit $10_H$ could be different from the number of IGBTs of the high-side transistor circuit $40_H$, and the number of diodes $11_{11}$-$11_{nL}$ of the second freewheeling circuit $10_L$ could be different from the number of IGBTs of the low-side transistor circuit $40_L$. Further, each of the diodes $11_{1H}$-$11_{nH}$, $11_{1L}$-$11_{nL}$ in the first and second freewheeling circuits $10_H$, $10_L$ shown in FIG. 8 can be activated and deactivated. That is, each of these diodes $11_{1H}$-$11_{nH}$, $11_{1L}$-$11_{nL}$ has a corresponding switch S2 connected in series thereto. However, it is also possible to have at least one of these diodes activated permanently by not providing a switch connected in series thereto.

The circuit with the half-bridge circuit $40_H$, $40_L$ and the freewheeling circuits $10_H$, $10_L$ can be employed in any kind of circuit application where a half-bridge circuit is required. According to one embodiment, the circuit is employed in a drive application for driving an electric motor. In this type of application, the IGBTs in the bipolar transistor circuits $40_H$, $40_L$ and the diodes $11_{1H}$-$11_{nH}$, $11_{1L}$-$11_{nL}$ in the freewheeling circuits $10_H$, $10_L$ may be stressed differently at different time instances during a drive operation. The IGBTs $12_{1H}$-$12_{nH}$, $12_{1L}$-$12_{nL}$ may be stressed more during those time periods in which power is supplied to the motor (connected to the output $21_L$, $22_H$ and not shown in FIG. 8) from the supply terminals $21_H$, $22_L$ via the half-bridge circuit $40_H$, $40_L$. The diodes $11_{1H}$-$11_{nH}$, $11_{1L}$-$11_{nL}$ may be stressed more during a braking operation in which power is fed back from the motor via the freewheeling circuits $10_H$, $10_L$ to the power supply terminals $21_H$, $22_L$. The IGBTs $12_{1H}$-$12_{nH}$, $12_{1L}$-$12_{nL}$ in the bipolar transistor circuits $40_H$, $40_L$ and the diodes $11_{1H}$-$11_{nH}$, $11_{1L}$-$11_{nL}$ in the freewheeling circuits $10_H$, $10_L$ may therefore be controlled individually. A drive circuit 30 controls the operation of the high-side transistor circuit $40_H$, of the low-side transistor circuit $40_L$ and of the freewheeling circuits $10_H$, $10_L$.

According to one embodiment, the drive circuit 30 is configured to switch on and off the high-side transistor circuit $40_H$ and the low-side transistor circuit $40_L$ dependent on an input signal in the way explained with reference to FIGS. 1 to 3 herein before, wherein the high-side transistor circuit $40_H$ may be switched on when the input signal $S_{in}$ has a high level, and the low-side transistor circuit $40_L$ may be switched on when the input signal $S_{in}$ has a low level. "To switch on" the high-side transistor circuit $40_H$ means that a first group of IGBTs of the high-side transistor circuit $40_H$ switches on as controlled by the input signal $S_{in}$, wherein a first subgroup is kept in the on-state for a first time period, and a second subgroup is switched off before the end of the first time period. Optionally, a second group of IGBTs of the high-side transistor circuit $40_H$ is not switched on. The drive circuit 30 may control the number of IGBTs in the first group and the second group and the number of IGBTs in the first and second subgroup dependent on a load current signal $S_{IH}$ representing a load current through the high-side transistor circuit $40_H$.

Equivalently, "to switch on" the low-side transistor circuit $40_L$ means that a first group of IGBTs of the low-side transistor circuit $40_L$ switches on as controlled by the input signal $S_{in}$, wherein a first subgroup is kept in the on-state for a first time period, and a second subgroup is switched off before the end of the first time period. Optionally, a second group of IGBTs of the low-side transistor circuit $40_L$ is not switched on. The drive circuit 30 may control the number of IGBTs in the first group and the second group and the number of IGBTs in the first and second subgroup dependent on a load current signal $S_{IL}$ representing a load current through the low-side transistor circuit $40_H$.

Further, the drive circuit 30 controls the freewheeling circuit $10_H$ dependent on the load current signal $S_{IH}$ representing the load current $I_H$ through the high-side transistor circuit $40_H$ and the freewheeling circuit $10_H$, respectively, and the drive circuit 30 controls the freewheeling circuit $10_L$ dependent on the load current signal $S_{IL}$ representing the load current $I_L$ through the low-side transistor circuit $40_L$ and the freewheeling circuit $10_L$, respectively.

According to one embodiment, one or more IGBTs of one of the high-side circuit $40_H$ and the low-side circuit $40_L$ and one or more diodes of this one of the high-side circuit $40_H$ and the low-side circuit $40_L$ are integrated in a power semiconductor module, which is a module including a substrate, such as a DCB (Direct Copper Bonding) substrate, on which the at least one IGBT and the at least one diode is mounted, and a housing. In this case and when there is a second group of IGBTs and diodes that are permanently deactivated in one switching cycle, the at least one IGBT and the corresponding diode of one module are deactivated.

Figure 9:
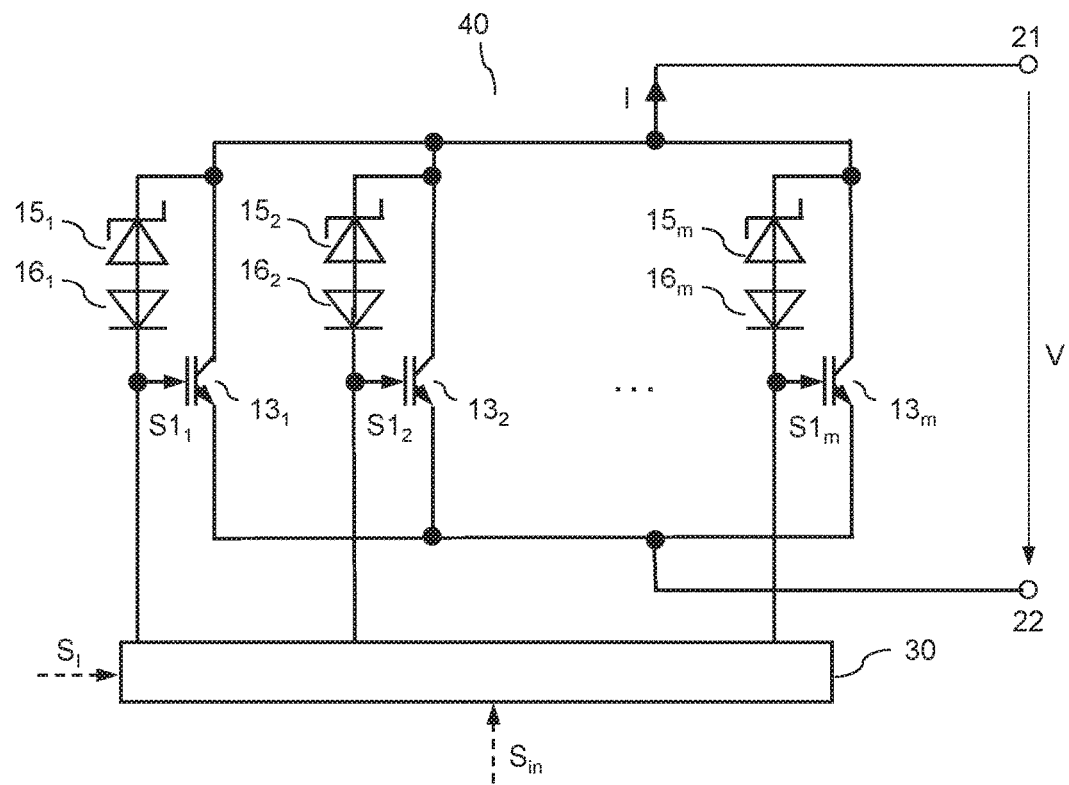
FIG. 9 illustrates one embodiment of a bipolar transistor circuit.

Under certain conditions, in the bipolar transistor circuit 40 of FIG. 1, a peak voltage (overvoltage) may occur when at least one IGBT is switched off. According to one embodiment, the bipolar transistor circuit 40 includes protection means that switch on at least some of the switched off IGBTs in case of an overvoltage condition. An embodiment of a bipolar transistor circuit 40 with overvoltage protection means is illustrated in FIG. 9. In this bipolar transistor circuit 40, those of the IGBTs $13_1$-$13_m$ that are switched off are switched on whenever the voltage V has a voltage level that is higher than a predefined voltage level. The predefined voltage level is such that voltage V reaches this voltage level only in case of an overvoltage scenario. In the embodiment of FIG. 9, the protection means includes Zener diodes $15_1$-$15_m$. Each of these Zener diodes $15_1$-$15_m$ is connected between the collector terminal and the gate terminal of one of the IGBTs $13_1$-$13_m$. Each of the Zener diodes $15_1$-$15_m$ is connected such that it switches on the corresponding IGBT $13_1$-$13_m$ when a load-path voltage (collector-emitter voltage) of the IGBT essentially reaches the breakdown voltage (Zener voltage) of the Zener diode $15_1$-$15_m$. The Zener diode $15_1$-$15_m$ switches on the IGBT $13_1$-$13_m$ independent of the corresponding drive signal $S1_1$-$S1_m$. That is, the Zener diode $15_1$-$15_m$ overrides the drive signal $S1_1$-$S1_m$ when the voltage V reaches the predefined threshold. When the IGBT $13_1$-$13_m$ that was originally switched off switches on, it takes a share of the overall current, thereby reducing the current through those IGBTs that were switched on before. The individual Zener diodes $15_1$-$15_m$ keep the IGBTs conducting until the voltage V between the nodes 21, 22 falls below the predefined threshold. Optionally, a bipolar diode $15_1$-$15_m$ is connected back to back to each of the Zener diodes $15_1$-$15_m$.

By way of example, also, a peak current (overcurrent) may occur in the diode circuit 10 when it is forward biased. Especially in operation scenarios in which at least one of the diodes $11_1$-$11_n$ is deactivated, there is the risk that the peak current overloads those diodes that are activated.

Figure 10:
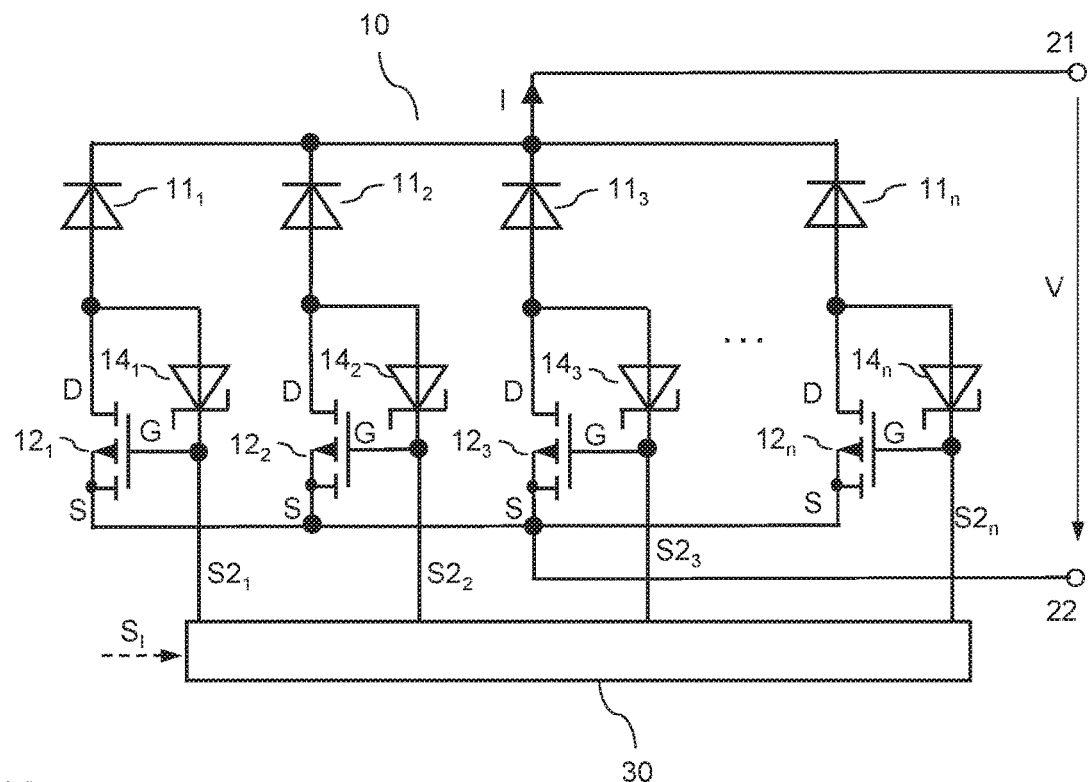
FIG. 10 illustrates one embodiment of a diode circuit.

According to one embodiment, the diode circuit 10 includes protection means that activate at least some of the deactivated diodes in case of an overcurrent condition. Another embodiment of a diode circuit 10 with overcurrent protection means is illustrated in FIG. 10. In this diode circuit 10, those of the switches $12_1$-$12_n$ that are switched off in order to deactivate the corresponding diode $11_1$-$11_n$ are switched on whenever the voltage V has a polarity that forward biases the diode circuit 10 and has a voltage level that is higher than an predefined voltage level. The predefined voltage level is such that voltage V reaches this voltage level only in case of an overcurrent scenario. In the embodiment of FIG. 10, the protection means include Zener diodes $14_1$-$14_n$. Each of these Zener diodes $14_1$-$14_n$ is connected between the drain terminal D and the gate terminal G of one of the switches $12_1$-$12_n$, that are implemented as p-type (enhancement) MOSFETs in the embodiment of FIG. 10. Each of these Zener diodes $14_1$-$14_n$ is connected such that it switches on the corresponding MOSFET $12_1$-$12_n$ when a load-path voltage (drain-source voltage) of the MOSFET essentially reaches the breakdown voltage (Zener voltage) of the Zener diode $14_1$-$14_n$. The Zener diode $14_1$-$14_n$ switches on the MOSFET $11_1$-$11_n$ independent of the corresponding drive signal $S2_1$-$S2_n$. That is, the Zener diode overrides the drive signal $S_1$-$S_n$ when the voltage V reaches the predefined threshold. When the MOSFET $12_1$-$12_n$ of a diode that was deactivated switches on, the corresponding diode $11_1$-$11_n$ takes a share of the overall current, thereby reducing the current through those diodes that were activated before. The individual Zener diodes keep the MOSFETs of deactivated diodes conducting until the voltage V between the nodes 21, 22 falls below the predefined threshold.

The deactivation means (switches) $12_1$-$12_n$ and the diodes $11_1$-$11_n$ can be integrated in the same package or module. According to one embodiment, a switch and the corresponding diode are integrated in a chip-on-chip arrangement with a first semiconductor chip including the diode and a second semiconductor chip including the switch.

Figure 11:
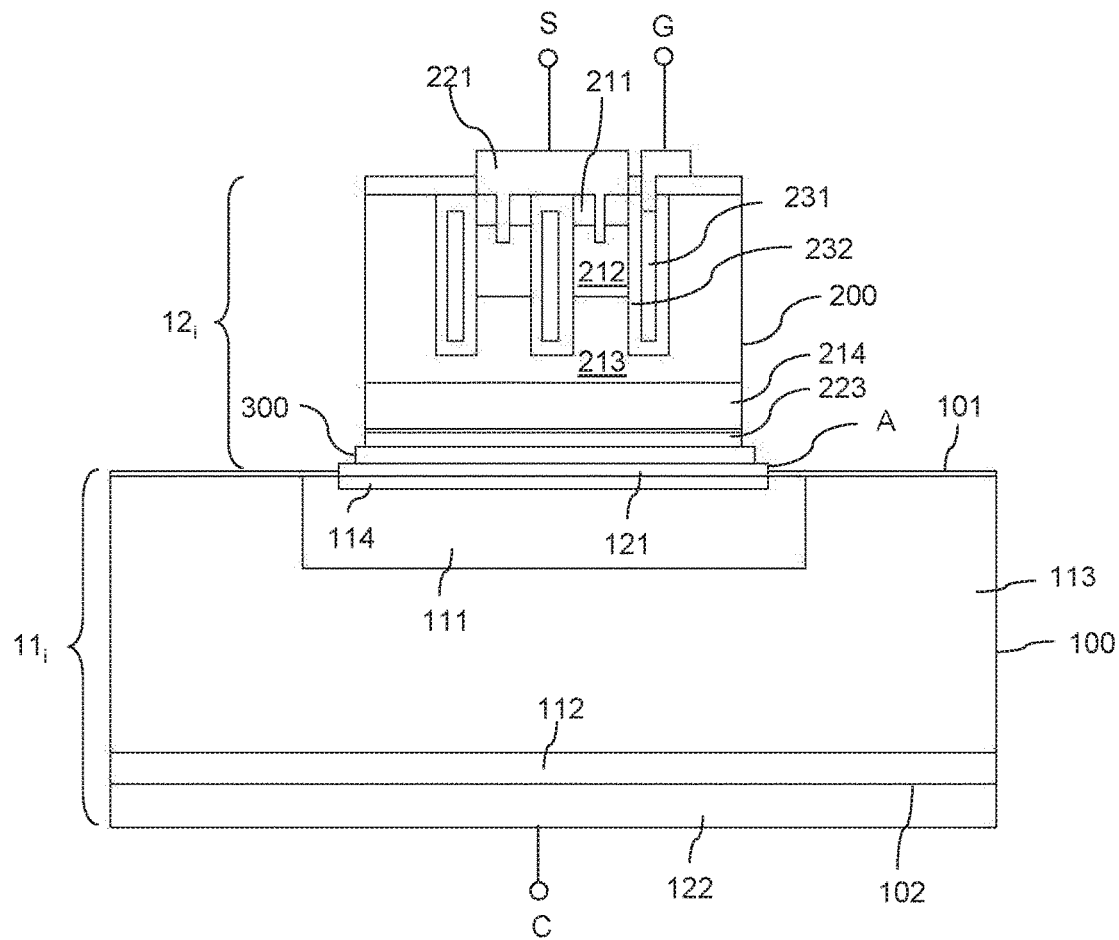
FIG. 11 illustrates an example of a chip-on-chip integration of a diode and a vertical p-MOS switch.

FIG. 11 illustrates one embodiment of such a chip-on-chip arrangement. In FIG. 11, reference character $11_i$ denotes the ith diode of the diodes $11_1$-$11_n$ as explained before, and reference character $12_i$ denotes the corresponding switch. Referring to FIG. 11, the ith diode $11_i$ is implemented as a vertical diode and includes a first semiconductor body 100 in which a first emitter region (anode region) 111 of a first conductivity type and a second emitter region (cathode region) 112 of the second conductivity type are arranged. The first and second emitter regions 111, 112 are spaced apart in a vertical direction of the first semiconductor body 100. A base region 113 of one of the first and second conductivity types and more lowly doped than the first and second emitter regions 111, 112 is arranged between the first and second emitter regions 111, 112. The first emitter region 111 is electrically connected to a first contact electrode 121 arranged on a first surface 101 of the first semiconductor body 100, and the second emitter region 112 is electrically connected to a second contact electrode 122 arranged on a second surface 102 opposite the first surface 101.

In the embodiment of FIG. 11, the MOSFET $12_i$ is implemented as a vertical MOSFET that includes at least one transistor cell in a second semiconductor body 200. The transistor cell includes a source region 211 electrically connected to a source (S) electrode 221, a body region 212 adjoining the source region 211 and a drift region 213. The body region 212 is located between the drift region 213 and the source region 211. The MOSFET further includes a drain region 214 that is electrically connected to a drain electrode 223, wherein the drift region 213 is arranged between the drain region 214 and the body region 212. The MOSFET further includes a gate electrode 231 adjacent the body region 212 and dielectrically insulated from the body region 212 by a gate dielectric 232. The gate electrode 231 includes several gate electrode sections, wherein each gate electrode section is adjacent the source and body regions 211, 212 of one transistor cell. Each of these gate electrode sections is electrically connected to the gate terminal G (although the connection between only one gate electrode section and the gate terminal G is visible in FIG. 10). The gate electrode 231 in a conventional manner serves to control a conducting channel in the body region 212 between the source region 211 and the drift region 213. The gate electrode 231 is electrically connected to a gate terminal G.

The MOSFET may include a plurality of transistor cells, wherein the individual transistor cells are connected in parallel by having their source region 211 electrically connected to a common source electrode 221. Further, the individual transistor cells share the drift region 213 and the drain region 214. The source electrode 221 is further connected to the body regions 212 of the individual transistor cells.

The MOSFET can be implemented as an n-type MOSFET or as a p-type MOSFET. In an n-type MOSFET, the source region 211, the drift region 213 and the drain region 214 are n-doped, while the body region 212 is p-doped. In a p-type MOSFET, the source region 211, the drift region 213 and the drain region 214 are p-doped, while the body region 212 is n-doped.

Referring to FIG. 11, the drain electrode 223 is electrically connected and mounted to the anode electrode 121 of the diode $11_i$. A connection layer 300, such as a solder layer, an electrically conducting glue layer, or the like, can be arranged between the anode electrode 121 and the drain electrode 223.

According to one embodiment, the MOSFET $12_i$ is a p-type MOSFET, the first emitter region 111 of the diode is p-doped, so as to form an anode region of the ith diode $11_i$, while the second emitter region 112 is n-doped, so as to form a cathode region. The base region 113 can either be n-doped or p-doped.

FIG. 11 shows one diode $11_i$ and the corresponding switch $12_i$. According to a further embodiment (not shown), several diodes are integrated in the semiconductor body 100. In this case, the individual diodes share the second emitter region 112 and the base region 113. The first emitter regions 111 of the individual diodes are spaced apart in a lateral direction of the semiconductor body 100. Optionally, vertical dielectric layers are arranged between the individual first emitter regions 111 of the individual diodes. On each of the first emitter regions 111 a MOSFET or another type of switch can be mounted in order to activate or deactivate the corresponding diode.

In the embodiments explained before, the circuit symbols of the individual diodes are circuit symbols of bipolar diodes (pin diodes). However, it is also possible, to implement the individual diodes as other types of diodes, such as Schottky diodes. A Schottky diode has a lower reverse recovery charge than a bipolar diode. It is even possible, to implement different types of diodes in one diode circuit 10. That is, at least one the diodes of the diode circuit 10 can be implemented as a Schottky diode, while at least another one of the diodes is implemented as a bipolar diode. In this embodiment, the Schottky diode may be connected such that it is always activated (does not include deactivation means). For example, the diode $11_1$ of FIG. 4 may be implemented as Schottky diode.

According to a further embodiment, at least one of the diodes $11_1$-$11_n$ of the diode circuit 10 is optimized to have a low reverse recovery charge stored in the diode in the forward biased mode. For example, a diode with a low reverse recovery charge can be obtained by implementing one of the emitter regions of the diode, such as emitter regions 111, 112 of FIG. 11, with low emitter efficiency. In this embodiment, the diode with the low efficient emitter may be connected such that it is always activated (does not include deactivation means). For example, the diode $11_1$ of FIG. 4 may be implemented as a low efficient emitter diode.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating a circuit, the circuit comprising a first node, a second node and a plurality of transistors coupled in parallel between the first node and the second node, the method comprising in one drive cycle:
    switching on transistors of a first group of the plurality of transistors at the same time, the first group comprising a first subgroup and a second subgroup and each of the first subgroup and the second subgroup comprising one or more of the transistors;
    switching off the transistors of the first subgroup at the end of a first time period; and
    switching off the transistors of the second subgroup before the end of the first time period.

2. The method of claim 1, wherein a selection of the first subgroup of transistors is dependent on a load condition of the circuit.

3. The method of claim 2, wherein the load condition is dependent on a current through the circuit.

4. The method of claim 2,
    wherein the circuit is operated in a plurality of subsequent drive cycles,
    wherein the load condition is detected in one drive cycle; and
    wherein the detected load condition is used to select the first subgroup in a next drive cycle.

5. The method of claim 3, wherein the second subgroup of transistors has an overall chip-size, and wherein the second subgroup is selected such that the overall chip-size increases as the current through the circuit decreases.

6. The method of claim 1, further comprising:
    switching off a second group of the plurality of transistors during the first time period.

7. The method of claim 6, wherein a selection of the second group of transistors is dependent on a load condition of the circuit.

8. The method of claim 7, wherein the load condition is dependent on a current through the circuit.

9. The method of claim 6,
    wherein the circuit is operated in a plurality of subsequent drive cycles,
    wherein the load condition is detected in one drive cycle, and
    wherein the detected load condition is used to select the second group in a next drive cycle.

10. The method of claim 7, wherein the second group of transistors has an overall chip-size, and wherein the second group is selected such that the overall chip-size of the second group increases as the current through the circuit decreases.

11. The method of claim 1, wherein the transistors are IGBTs.

12. The method of claim 1, further comprising:
    applying a first voltage between the first node and the second node for an on-time, the first voltage configured to forward bias a plurality of diodes coupled in parallel between the first node and the second node in parallel to the plurality of transistors;
    applying a second voltage between the first node and the second node for an off-time after the on-time, the second voltage configured to reverse bias the diodes; and
    switching a first group of the diodes from an activation state to a deactivation state before the end of the on-time, the first group of diodes comprising one or more but less than all of the plurality of diodes.

13. The method of claim 12, wherein a selection of the first group of diodes is dependent on a load condition of the circuit.

14. The method of claim 13, wherein the load condition is dependent on a current through the circuit.

15. The method of claim 12, further comprising:
    deactivating a further group of the plurality of diodes during the on-time, the further group of diodes comprising one or more but less than all of the plurality of diodes.

16. The method of claim 12, wherein a selection of the further group of diodes is dependent on a load condition of the circuit.

17. The method of claim 16, wherein the load condition is dependent on a current through the circuit.

18. The method of claim 1, wherein a plurality of diodes is coupled in parallel between the first node and the second node in parallel to the plurality of transistors, the method further comprising:
switching a group of the plurality of diodes from an activation state to a deactivation state for time periods in which the second subgroup of transistors is switched off, the group of diodes comprising one or more but less than all of the plurality of diodes.

19. The method of claim 6, wherein a plurality of diodes is coupled in parallel between the first node and the second node in parallel to the plurality of transistors, the method further comprising:
switching a group of the plurality of diodes from an activation state to a deactivation state for time periods in which the second group of transistors is switched off, the group of diodes comprising one or more but less than all of the plurality of diodes.

20. A circuit, comprising:
a transistor circuit comprising a first node, a second node, and a plurality of transistors coupled in parallel between the first node and the second node; and
a drive circuit configured to:
switch on a first group of the plurality of transistors at the same time, the first group comprising a first subgroup and a second subgroup and each of the first subgroup and the second subgroup comprising one or more of the transistors,
switch off the first subgroup at the end of a first time period; and
switch off the second subgroup before the end of the first time period.

21. The circuit of claim 20, wherein the drive circuit is configured to select the first subgroup of transistors dependent on a load condition of the circuit.

22. The circuit of claim 21, wherein the load condition is dependent on a current through the circuit.

23. The circuit of claim 21,
wherein the transistor circuit is configured to operate in a plurality of subsequent drive cycles,
wherein the drive circuit is configured to detect the load condition in one drive cycle and to use the detected load condition to select the first group in a next drive cycle.

24. The circuit of claim 22, wherein the first subgroup of transistors has an overall chip-size, and wherein the drive circuit is configured to select the first subgroup such that the overall chip-size increases as the current through the circuit increases.

25. The circuit of claim 20, wherein the drive circuit is further configured to deactivate a second group of the plurality of transistors during the first time period, the second group of transistors comprising one or more but less than all of the plurality of transistors.

26. The circuit of claim 25, wherein the drive circuit is configured to select the second group of transistors dependent on a load condition of the circuit.

27. The circuit of claim 26, wherein the load condition is dependent on a current through the circuit.

28. The circuit of claim 20, further comprising:
a diode circuit comprising a plurality of diodes coupled in parallel between the first node and the second node in parallel to the plurality of transistors, the diode circuit configured to be forward biased in an on-time and reverse biased in an off-time; and
a deactivation circuit configured to switch a second group of the plurality of diodes from an activation state to a deactivation state before the end of the on-time period, the second group of diodes comprising one or more but less than all of the plurality of diodes.

29. The circuit of claim 28, wherein the deactivation circuit comprises:
at least one switch connected in series with at least one of the plurality of diodes; and
wherein the drive circuit is further configured to switch on and switch off the at least one switch.

30. The circuit of claim 28, wherein the deactivation circuit is configured to select the second group of diodes dependent on a load condition of the circuit.

31. The circuit of claim 30, wherein the load condition is dependent on a current through the circuit.

32. The circuit of claim 28, wherein the deactivation circuit is further configured to deactivate a further group of the plurality of diodes during the on-time, the further group of diodes comprising one or more but less than all of the plurality of diodes.

33. The circuit of claim 28, further comprising:
switching a third group of the plurality of diodes from an activation state to a deactivation state for time periods in which the second subgroup of transistors is switched off, the third group of diodes comprising one or more but less than all of the plurality of diodes.

34. The circuit of claim 28, further comprising:
switching a fourth group of the plurality of diodes from an activation state to a deactivation state for time periods in which the second group of transistors is switched off, the fourth group of diodes comprising one or more but less than all of the plurality of diodes.

35. A method of operating a circuit comprising a first node, a second node and a plurality of transistors coupled in parallel between the first node and the second node, the method comprising in one drive cycle:
selecting a first group of the plurality of transistors, the first group comprising a first subgroup and a second subgroup and each of the first subgroup and the second subgroup comprising one or more transistors;
switching on the transistors of the first group at the same time at the beginning of a first time period;
switching off the transistors of the first subgroup at the end of the first time period; and
keeping switched off the transistors of the second subgroup before the end of the first time period.

* * * * *